US010872546B2

United States Patent
Xue et al.

(10) Patent No.: US 10,872,546 B2
(45) Date of Patent: Dec. 22, 2020

(54) SHIFT REGISTER UNIT AND METHOD FOR DRIVING THE SAME, GATE DRIVING CIRCUIT AND DISPLAY APPARATUS

(71) Applicants: BOE Technology Group Co., Ltd., Beijing (CN); Hefei BOE Optoelectronics Technology Co., Ltd., Anhui (CN)

(72) Inventors: Wei Xue, Beijing (CN); Jian Tao, Beijing (CN); Hongmin Li, Beijing (CN); Ying Wang, Beijing (CN)

(73) Assignees: BOE TECHNOLOGY GROUP CO., LTD., Hefei (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 172 days.

(21) Appl. No.: 16/114,545

(22) Filed: Aug. 28, 2018

(65) Prior Publication Data
US 2019/0251887 A1  Aug. 15, 2019

(30) Foreign Application Priority Data
Feb. 12, 2018 (CN) .......................... 2018 1 0147833

(51) Int. Cl.
*G11C 19/00* (2006.01)
*G09G 3/20* (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 8,537,094 B2 * 9/2013 Yang ..................... G09G 3/3677
345/100
9,269,455 B2 * 2/2016 Liu ........................ G11C 19/28
(Continued)

FOREIGN PATENT DOCUMENTS

CN    104299590 A    1/2015
CN    105096879 A    11/2015
(Continued)

OTHER PUBLICATIONS

First Office Action, including Search Report, for Chinese Patent Application No. 201810147833.9, dated Jan. 19, 2020, 19 pages.

*Primary Examiner* — Tuan T Lam
(74) *Attorney, Agent, or Firm* — Westman, Champlin & Koehler, P.A.

(57) ABSTRACT

The embodiments of the present application disclose a shift register unit and a method for driving the same, a gate driving circuit and a method for driving the same, and a display apparatus. The shift register unit comprises an input sub-circuit connected to an input signal terminal and a pull-up control node, and configured to charge the pull-up control node under control of an input signal; and an output sub-circuit connected to the pull-up control node, a clock signal terminal, a first voltage terminal, and an output signal terminal, and configured to output a first constant voltage to the output signal terminal under control of a clock signal and the pull-up control node.

16 Claims, 10 Drawing Sheets

US 10,872,546 B2
Page 2

(51) Int. Cl.
   *G11C 19/28* (2006.01)
   *G09G 3/36* (2006.01)
(52) U.S. Cl.
   CPC .............. *G09G 2300/0809* (2013.01); *G09G 2310/0286* (2013.01); *G09G 2310/08* (2013.01)

(56) References Cited

U.S. PATENT DOCUMENTS

| | | | |
|---|---|---|---|
| 10,204,587 B2 | 2/2019 | Chen et al. | |
| 10,572,038 B2 * | 2/2020 | Gu et al. | |
| 2008/0101529 A1 * | 5/2008 | Tobita | G09G 3/3677 377/64 |
| 2010/0244946 A1 * | 9/2010 | Murakami | G09G 3/3677 327/564 |
| 2012/0098804 A1 * | 4/2012 | Ohhashi | G09G 3/3685 345/204 |
| 2012/0213323 A1 * | 8/2012 | Tsai | G11C 19/184 377/64 |
| 2014/0168049 A1 * | 6/2014 | Gu | G09G 3/3685 345/100 |
| 2014/0168050 A1 * | 6/2014 | Gu | G09G 3/3611 345/100 |
| 2015/0036784 A1 * | 2/2015 | Qing | G11C 19/184 377/68 |
| 2015/0318052 A1 * | 11/2015 | Li | G11C 19/28 377/64 |
| 2016/0125955 A1 | 5/2016 | Pang | |
| 2016/0172054 A1 * | 6/2016 | Shao | G11C 19/184 345/100 |
| 2016/0322115 A1 * | 11/2016 | Xu | G11C 19/28 |
| 2016/0351156 A1 * | 12/2016 | Wu | G11C 19/28 |
| 2016/0358566 A1 * | 12/2016 | Li | G11C 19/28 |
| 2016/0372069 A1 * | 12/2016 | Lv | G09G 3/36 |
| 2017/0018243 A1 * | 1/2017 | Huang | G09G 3/36 |
| 2017/0193885 A1 * | 7/2017 | Feng | G11C 19/28 |
| 2017/0364170 A1 | 12/2017 | Gu et al. | |
| 2018/0308408 A1 * | 10/2018 | Chen | G09G 3/20 |
| 2019/0012976 A1 | 1/2019 | Chen et al. | |
| 2019/0206352 A1 * | 7/2019 | Wang | G09G 3/3677 |
| 2019/0279588 A1 * | 9/2019 | Kim | G09G 3/3677 |

FOREIGN PATENT DOCUMENTS

| | | |
|---|---|---|
| CN | 106531112 A | 3/2017 |
| CN | 106601208 A | 4/2017 |
| CN | 106875913 A | 6/2017 |

* cited by examiner

SHIFT REGISTER UNIT AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201810147833.9, filed on Feb. 12, 2018, which is incorporated herein by reference in its entirety.

TECHNICAL FIELD

The present disclosure relates to the display field, and more particularly, to a shift register unit and a method for driving the same, a gate driving circuit and a method for driving the same, and a display apparatus.

BACKGROUND

In a Thin Film Transistor (TFT)-based Liquid Crystal Display (LCD), a gate driving circuit for driving a gate may be formed on a display panel to form a Gate On Array (GOA) panel. The gate driving circuit comprises a plurality of cascaded shift register units. In a gate driving circuit in the related art, an output signal of a next stage of shift register unit is usually used as a reset signal of a current stage of shift register unit, and an output signal of a previous stage of shift register unit is used as an input signal of the current stage of shift register unit.

However, especially in a gate driving circuit for a large-sized display apparatus in the related art, the shift register unit may exhibit excessive power consumption.

SUMMARY

Embodiments of the present disclosure provide a shift register unit and a method for driving the same, a gate driving circuit and a method for driving the same, and a display apparatus.

According to an aspect of the embodiments of the present disclosure, there is provided a shift register unit, comprising an input signal terminal configured to receive an input signal, a clock signal terminal configured to receive a clock signal, a first voltage terminal configured to receive a first constant voltage, and an output signal terminal configured to output a gate control signal, the shift register unit further comprising:

an input sub-circuit connected to the input signal terminal and a pull-up control node, and configured to charge the pull-up control node under control of the input signal; and an output sub-circuit connected to the pull-up control node, the clock signal terminal, the first voltage terminal, and the output signal terminal, and configured to output the first constant voltage to the output signal terminal under control of the clock signal and the pull-up control node.

In an example, the output sub-circuit comprises a first transistor, a second transistor and a first capacitor, wherein the first transistor has a gate connected to the clock signal terminal, a first electrode connected to the pull-up control node, and a second electrode connected to a gate of the second transistor via a first node; and the second transistor has a first electrode connected to the first voltage terminal, and a second electrode connected to the output signal terminal; and the first capacitor has a first terminal connected to the output signal terminal, and a second terminal connected to the first node.

In an example, the shift register unit further comprises a second voltage terminal configured to receive a second voltage signal, wherein the output sub-circuit further comprises a second capacitor and a third transistor, wherein the second capacitor has a first terminal connected to the pull-up control node, and a second terminal connected to the first terminal of the first capacitor; and the third transistor has a gate connected to the input signal terminal, a first electrode connected to the second voltage terminal, and a second electrode connected to the first node.

In an example, the first capacitor has a capacitance value greater than that of the second capacitor.

In an example, the shift register unit further comprises a reset signal terminal configured to receive a reset signal, a third voltage terminal configured to receive a third voltage signal, and a reset sub-circuit, wherein the reset sub-circuit is connected to the pull-up control node, the reset signal terminal, and the third voltage terminal respectively, and is configured to reset the pull-up control node to the third voltage under control of a reset signal.

In an example, the output sub-circuit further comprises a fourth transistor and a fifth transistor, wherein the fourth transistor has a gate connected to the reset signal terminal, a first electrode connected to the second voltage terminal, and a second electrode connected to the first node; and the fifth transistor has a gate connected to a pull-down control node, a first electrode connected to the second voltage terminal, and a second electrode connected to the output signal terminal.

In an example, the shift register unit further comprises a fourth voltage terminal configured to receive a fourth voltage signal, a pull-up control sub-circuit, and a pull-down control sub-circuit, wherein the pull-up control sub-circuit is connected to the pull-up control node, the pull-down control node, and the second voltage terminal, and is configured to provide the second voltage signal from the second voltage terminal to the pull-up control node under control of the pull-down control node; and the pull-down control sub-circuit is connected to the pull-up control node, the pull-down control node, the second voltage terminal, and the fourth voltage terminal, and is configured to provide the second voltage signal or the fourth voltage signal to the pull-down control node under control of the pull-up control node and the fourth voltage signal.

In an example, the pull-up control sub-circuit comprises a sixth transistor having a gate connected to the pull-down control node, a first electrode connected to the pull-up control node, and a second electrode connected to the second voltage terminal; and the pull-down control sub-circuit comprises a seventh transistor and an eighth transistor, wherein the seventh transistor has a gate connected to the pull-up control node, a first electrode connected to the second voltage terminal, and a second electrode connected to the pull-down control node; and the eighth transistor has a gate and a first electrode connected to the fourth voltage terminal, and a second electrode connected to the pull-down control node.

In an example, the shift register unit further comprises a fifth voltage terminal configured to receive a fifth voltage signal. The input sub-circuit comprises a ninth transistor having a gate connected to the input signal terminal, a first electrode connected to the fifth voltage terminal, and a second electrode connected to the pull-up control node.

In an example, the reset sub-circuit comprises a tenth transistor having a gate connected to the reset signal terminal, a first electrode connected to the third voltage terminal, and a second electrode connected to the pull-up control node.

According to another aspect of the embodiments of the present disclosure, there is provided a gate driving circuit, comprising a plurality of cascaded shift register units according to the embodiments of the present disclosure, wherein an input signal terminal of a first stage of shift register unit and a reset signal terminal of a last stage of shift register unit are connected to a vertical starting signal line; except for the first stage of shift register unit, an input signal terminal of each of remaining stages of shift register units is connected to an output signal terminal of a previous stage of shift register unit; and except for the last stage of shift register unit, a reset signal terminal of each of remaining stages of shift register units is connected to an output signal terminal of a next stage of shift register unit.

According to another aspect of the embodiments of the present disclosure, there is provided a display apparatus, comprising the gate driving circuit according to the embodiments of the present disclosure.

According to another aspect of the embodiments of the present disclosure, there is provided a method for driving the shift register unit according to the embodiments of the present disclosure, comprising:

in a first phase, charging the pull-up control node through the input sub-circuit under control of an input signal;

in a second phase, transmitting a first constant voltage to the output signal terminal through the output sub-circuit under control of the pull-up control node and a clock signal; and in a third phase, resetting the pull-up control node and the first node to a first level under control of a reset signal.

In an example, the first constant voltage has a valid level and the first level is an invalid level.

According to another aspect of the embodiments of the present disclosure, there is provided a method for driving the gate driving circuit according to the embodiments of the present disclosure. The method comprises: providing a vertical starting signal to the input signal terminal of the first stage of shift register unit and the reset signal terminal of the last stage of shift register unit; and providing a fifth voltage having a valid level and a third voltage having an invalid level.

Alternatively, the method may comprise: providing a vertical starting signal to the input signal terminal of the first stage of shift register unit and the reset signal terminal of the last stage of shift register unit; and providing a fifth voltage having an invalid level and a third voltage having a valid level.

Alternatively, the method may comprise: providing a vertical starting signal to the input signal terminal of the first stage of shift register unit and the reset signal terminal of the last stage of shift register unit; providing, in odd-numbered frames, a fifth voltage having a valid level and a third voltage having an invalid level; and providing, in even-numbered frames, a fifth voltage having an invalid level and a third voltage having a valid level.

Alternatively, the method may comprise: providing a vertical starting signal to the input signal terminal of the first stage of shift register unit and the reset signal terminal of the last stage of shift register unit; providing, in odd-numbered frames, a fifth voltage having an invalid level and a third voltage having a valid level; and providing, in even-numbered frames, a fifth voltage having a valid level and a third voltage having an invalid level.

DETAILED DESCRIPTION

Figure 1:
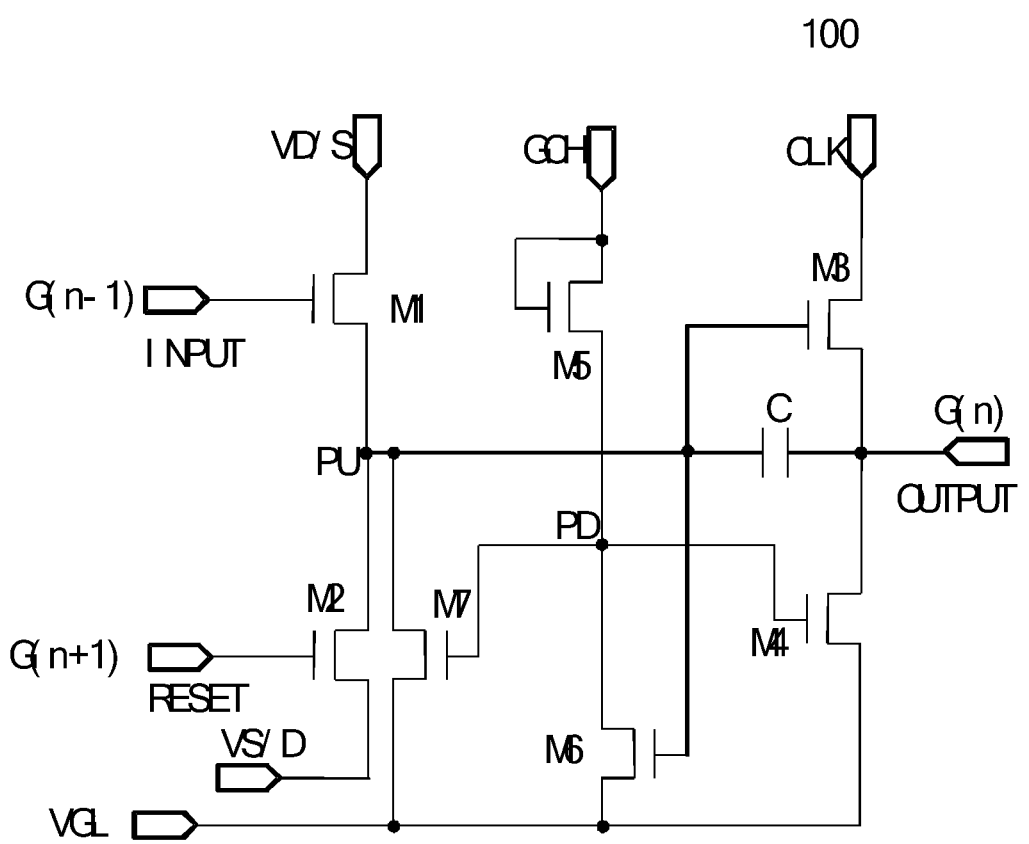
FIG. 1 illustrates an exemplary diagram of a shift register unit.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. It is apparent that the described embodiments are a part of the embodiments of the present disclosure, instead of all the embodiments. All other embodiments obtained by those of ordinary skill in the art based on the described embodiments of the present disclosure without any creative work are within the protection scope of the present disclosure. It should be illustrated that throughout the accompanying drawings, the same elements are represented by the same or similar reference signs. In the following description, some specific embodiments are for illustrative purposes only, and are not to be construed as limiting the present disclosure, but only examples of the embodiments of the present disclosure. Conventional structures or configurations will be omitted when they may cause confusion to the understanding of the present disclosure. It should be illustrated that shapes and sizes of various components in the accompanying drawings do not reflect true sizes and proportions, but merely illustrate contents of the embodiments of the present disclosure.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components from each other.

Furthermore, in the description of the embodiments of the present disclosure, the term "connected with" or "connected to" may mean that two components are directly connected, or that two components are connected via one or more other components. In addition, the two components may be connected or coupled by wire or wirelessly.

Transistors used in the embodiments of the present disclosure may all be thin film transistors or field effect transistors or other devices having the same characteristics. In some embodiments, the thin film transistors used in the embodiments of the present disclosure may be oxide semiconductor transistors. As a source and a drain of a thin film transistor used here are symmetrical, the source and the drain thereof are interchangeable. In the embodiments of the present disclosure, one of the source and the drain is referred to as a first electrode, and the other of the source and the drain is referred to as a second electrode. In the following examples, an N-type thin film transistor is taken as an example for illustration. It can be understood by those skilled in the art that the embodiments of the present disclosure are clearly applicable to a case of P-type thin film transistors.

Further, in the description of the embodiments of the present disclosure, the terms "first level" and "second level" are only used to distinguish magnitudes of the two levels from each other. For example, the following description will be made by taking the "first level" being a relatively low level and the "second level" being a relatively high level as an example. It can be understood by those skilled in the art that the present disclosure is not limited thereto. The term "valid level" refers to a level for causing a transistor to be turned on when the level is applied to a gate of the transistor, and the term "invalid level" refers to a voltage for causing a transistor to be turned off when the level is applied to a gate of the transistor. In a case where an N-type thin film transistor is taken as an example for description, the "valid level" corresponds to the "second level" and the "invalid level" corresponds to the "first level".

Figure 2:
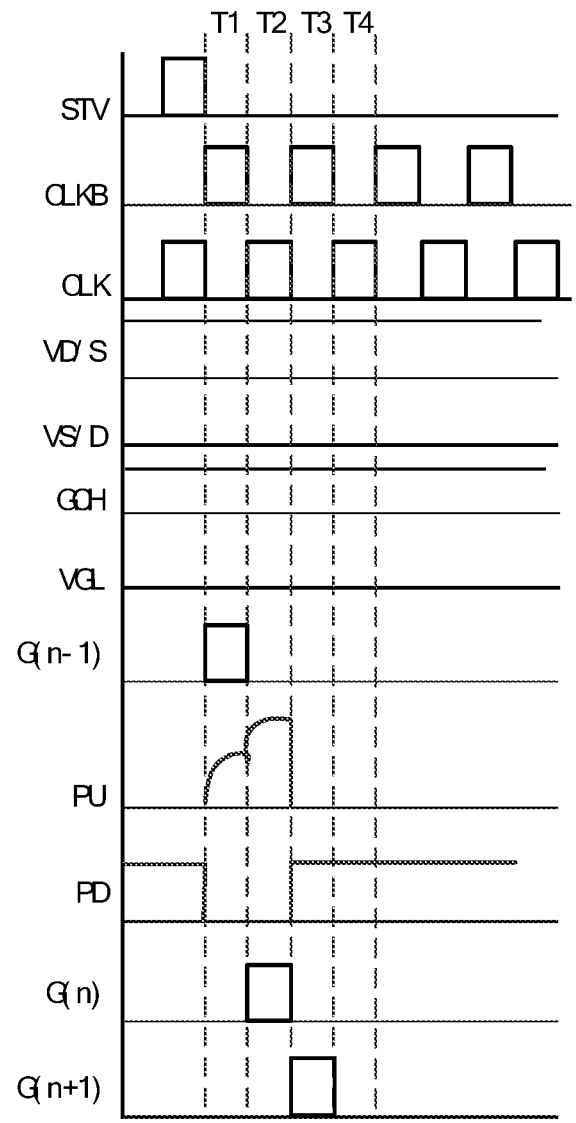
FIG. 2 illustrates an operational timing diagram of the shift register unit of FIG. 1.
Figure 3:
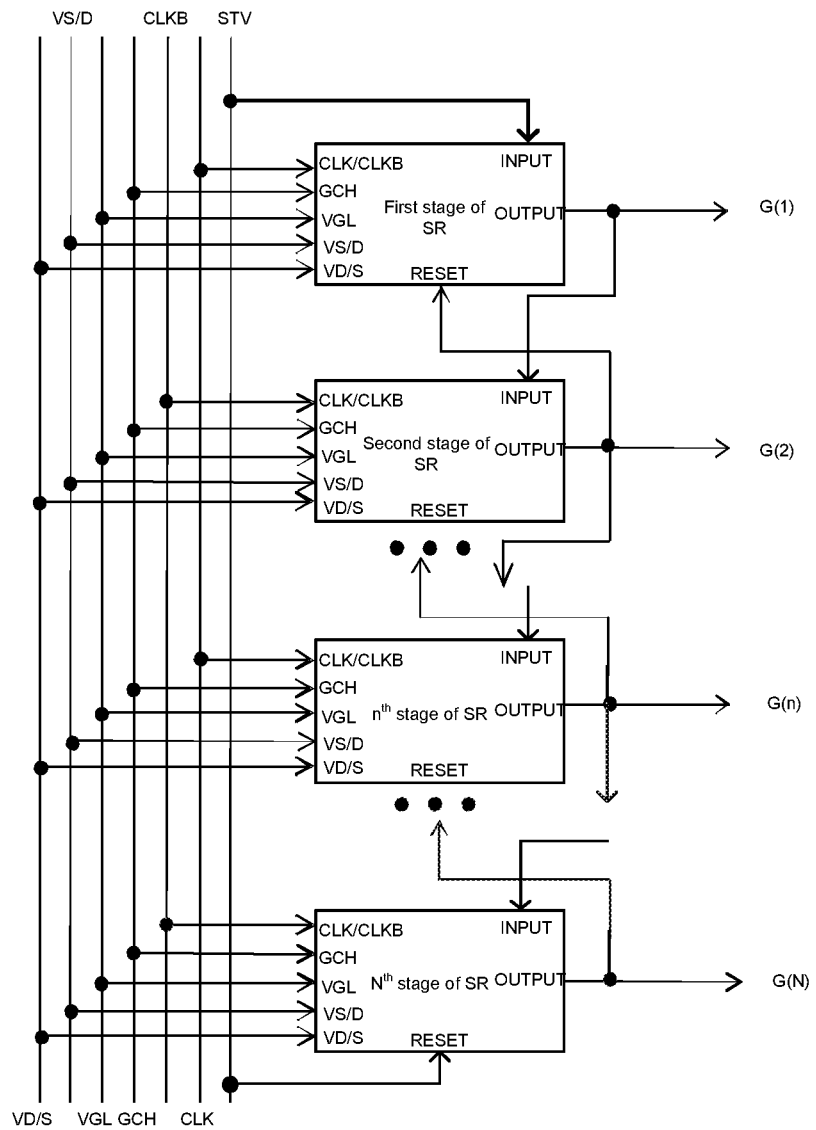
FIG. 3 illustrates a diagram of a gate driving circuit comprising a plurality of cascaded shift register units shown in FIG. 1.

FIG. 1 illustrates a schematic circuit diagram of an exemplary shift register unit 100. The shift register unit of FIG. 1 may implement bidirectional scanning, wherein compared with forwarding scanning, when backward scanning is implemented, it only needs to exchange a timing of a clock signal CLK with a timing of a clock signal CLKB and exchange a timing of a voltage signal VD/S with a timing of a voltage signal VS/D. FIG. 2 illustrates a schematic operational timing diagram of the shift register unit of FIG. 1, and FIG. 3 illustrates a diagram of a gate driving circuit comprising a plurality of cascaded shift registers of FIG. 1. Next, an operation of the shift register unit 100 will be briefly described by taking forward scanning as an example in conjunction with FIGS. 1, 2, and 3. It should be illustrated that the present disclosure will be described by taking the shift register unit 100 being an $n^{th}$ stage of shift register SR in N stages of cascaded shift registers as an example, where N is an integer greater than or equal to 2, and n is an integer greater than or equal to 2 and less than N. It can be understood by those skilled in the art that terms such as an $n^{th}$ stage, an $(n-1)^{th}$ stage, and an $(n+1)^{th}$ stage, as used herein, only represents that the $n^{th}$ stage is a stage adjacent to the $(n-1)^{th}$ stage and the $(n+1)^{th}$ stage. Although a case where each stage comprises a single shift register is illustrated in FIG. 3, this is merely exemplary, and in other embodiments, each stage may also comprise a plurality of shift register units.

As shown in FIG. 3, an $n^{th}$ stage of shift register SR has an INPUT terminal connected to an OUTPUT terminal of an $(n-1)^{th}$ stage of SR, and a RESET terminal connected to an OUTPUT terminal of an $(n+1)^{th}$ stage of SR. Specifically, an INPUT terminal of a first stage of SR and a RESET terminal of an $N^{th}$ stage of SR are connected to an STV signal line to receive an STV signal. A clock signal terminal of the $n^{th}$ stage of SR may be connected to a CLK signal or a CLKB signal. In the following example, the present disclosure will be described by taking the clock signal terminal of the $n^{th}$ stage of SR being connected to the CLK signal as an example.

In a first phase T1 in FIG. 2, the input signal terminal INPUT of the $n^{th}$ stage of shift register 100 in FIG. 1 receives a high level signal G(n−1) output at the OUTPUT terminal of the $(n-1)^{th}$ stage, so that a transistor M1 is turned on; and a clock signal terminal CLK is at a low potential, and a VD/S signal at a high potential charges a capacitor C, so that a potential at a pull-up node PU is pulled up, and a transistor M6 is turned on. At this time, as GCH is at a high level, a transistor M5 is turned on. By designing a ratio between channel aspect ratios of M5 and M6, a node PD is at a low potential at this time to cause a transistor M4 and a transistor M7 to be turned off, thereby ensuring that the output signal terminal OUTPUT stably outputs a low level.

In a second period T2, G(n−1) received at the INPUT terminal becomes a low level, and the transistor M1 is turned off. At this time, the pull-up node PU continues to be maintained at a high potential, and a transistor M3 is maintained in a turn-on state. At this time, the clock signal input terminal CLK is at a high potential. Due to the bootstrapping effect of the capacitor C, the voltage at the pull-up node PU is further pulled up, and the transistor M3 is turned on, so that a driving signal G(n) at a high level is output to the output signal terminal OUTPUT. At this time, the pull-up node PU is at a high potential, and the transistor M6 is still in a turn-on state, so that the transistor M4 and the transistor M7 are maintained in a turn-off state, thereby ensuring that the signal is output stably.

In a third phase T3, a reset signal input terminal RESET receives an output signal G(n+1) at a high level from the $(n+1)^{th}$ stage. The high level signal at the reset signal input terminal RESET causes a transistor M2 to be turned on, to pull down the pull-up node PU to VS/D at a low potential, thereby turning off the transistor M3 so that it no longer outputs a clock signal CLK. At the same time, as the potential at the pull-up node PU is pulled down, the transistor M6 is in a turn-off state, which no longer discharges the PD point. As GCH is at a high level, the transistor M5 is turned off, so that the level at the output signal terminal OUTPUT is pulled down to VGL.

In a fourth phase T4, as GCH is at a high potential, the transistor M5 is turned on. At this time, the potential at the node PD is pulled up, which causes the transistor M4 and the transistor M7 to be turned on, and further causes the pull-up node PU and the output signal terminal OUTPUT to be further discharged (de-noised). This eliminates a coupling noise voltage generated by the clock signal CLK, thereby ensuring a stable low voltage output at the output signal terminal OUTPUT.

Before the arrival of a next frame, the shift register 100 is always in the fourth phase T4, to continuously de-noise the circuit, thereby further ensuring stable output of the signal.

As the size of the display panel increases, the power consumption of the gate driving circuit increases. In the shift register unit shown in FIG. 1 for example, a source of the transistor M3 is connected to a clock signal, and corresponding gate lines in an Active Area (AA) of the display panel are driven through an output signal of a drain. It has been discovered by the applicant that as the output signal G(n) of the transistor M3 drives a corresponding $n^{th}$ row of gate lines, the transistor M3 is generally required to be large in size. However, in the shift register circuit in the related art, the source of the transistor M3 is connected to the clock signal CLK, which may cause a capacitor inherent to the transistor M3 (including a parasitic capacitor and a gate-drain capacitor Cgd of the transistor M3) to be repeatedly charged and discharged, thereby resulting in a large dynamic power consumption.

Figure 4A:
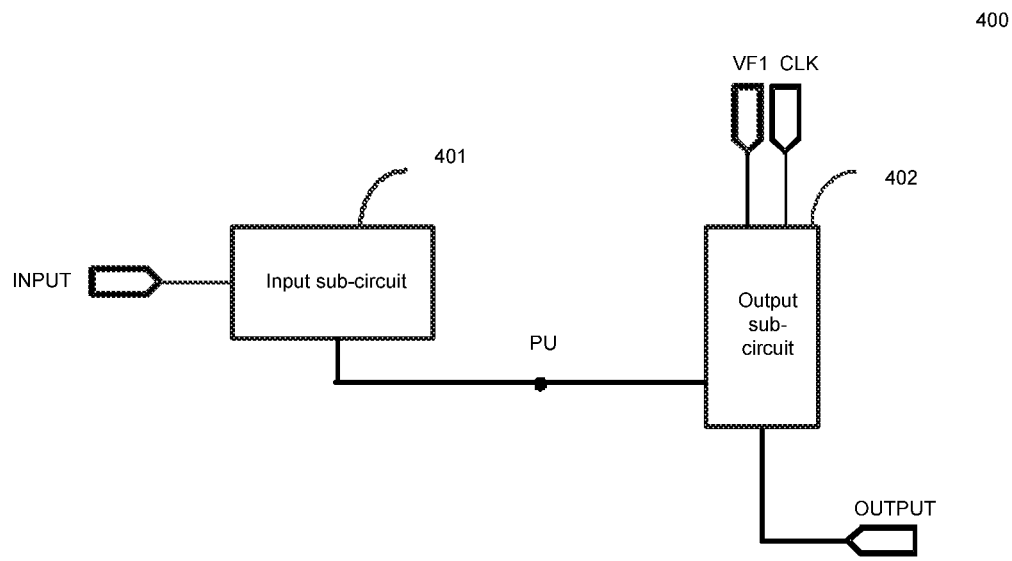
FIG. 4A illustrates a schematic block diagram of a shift register unit according to an embodiment of the present disclosure.

Therefore, the present disclosure provides a shift register unit. FIG. 4A illustrates a schematic block diagram of a shift register unit according to an embodiment of the present disclosure. As shown in FIG. 4A, the shift register unit 400 according to the embodiment of the present disclosure may comprise an input sub-circuit 401 and an output sub-circuit 402. It can be understood by those skilled in the art that one or more of these sub-circuits may be omitted, or other sub-circuits may be added, or modifications may be made to various sub-circuits, or any combination thereof, which fall within the protection scope of the present disclosure.

An input sub-circuit 401 is connected to an input signal terminal INPUT configured to receive an input signal Input and a pull-up control node PU. The input sub-circuit 401 is configured to charge the pull-up control node PU under control of the input signal Input. An output sub-circuit 402 is connected to the pull-up control node PU, a clock signal terminal CLK configured to receive a clock signal Clk/Clkb, and a first voltage terminal VF1 configured to receive a first constant voltage vf1. The output sub-circuit 402 is configured to transmit the first constant voltage vf1 to an output signal terminal OUTPUT under control of the clock signal Clk/Clkb and the pull-up control node PU.

For example, according to the embodiment of the present disclosure, the first voltage terminal VF1 may be connected to a signal VDD of a gate driving circuit.

Figure 4B:
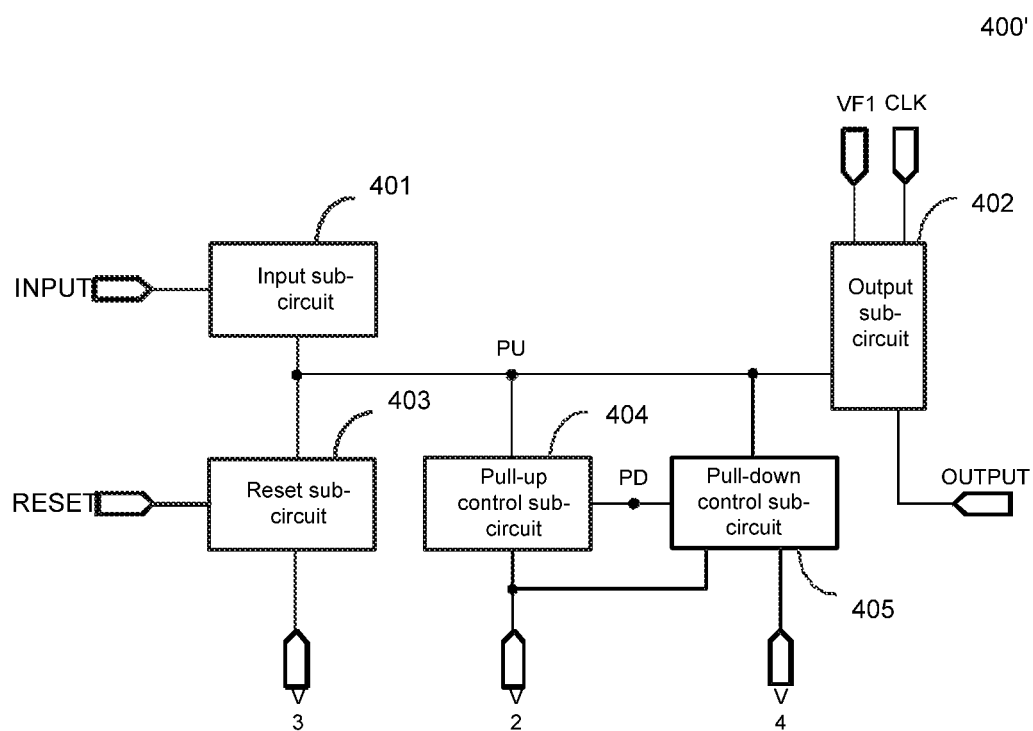
FIG. 4B illustrates a schematic block diagram of a shift register unit according to another embodiment of the present disclosure.

FIG. 4B illustrates a schematic block diagram of a shift register unit according to another embodiment of the present disclosure. As shown in FIG. 4B, in addition to the input sub-circuit 401 and the output sub-circuit 402, the shift register unit 400' according to the embodiment of the present disclosure may further comprise a reset sub-circuit 403, a pull-up control sub-circuit 404, and a pull-down control sub-circuit 405. It can be understood by those skilled in the art that one or more of these sub-circuits may be omitted, or other sub-circuits may be added, or modifications may be made to various sub-circuits, or any combination thereof, which fall within the protection scope of the present disclosure.

The reset sub-circuit 403 has a reset signal terminal RESET configured to receive a reset signal Reset. The reset sub-circuit 403 is connected to the pull-up control node PU and a third voltage terminal V3 configured to receive a third voltage signal v3 respectively, and the reset sub-circuit 403 is configured to reset the pull-up control node PU to the third voltage under control of the reset signal Reset. The pull-up control sub-circuit 404 is connected to the pull-up control node PU, a pull-down control node PD, and a second voltage terminal V2 configured to receive a second voltage v2. The pull-up control sub-circuit 404 is configured to provide the second voltage signal v2 from the second voltage terminal V2 to the pull-up control node PU under control of the pull-down control node PD. The pull-down control sub-circuit 405 is connected to the pull-up control node PU, the pull-down control node PD, the second voltage terminal V2, and a fourth voltage terminal V4 configured to receive a fourth voltage signal v4, and is configured to provide the second voltage signal or the fourth voltage signal to the pull-down control node under control of the pull-up control node and the fourth voltage signal.

For example, according to the embodiment of the present disclosure, the second voltage terminal V2 may be connected to a voltage signal VGL of the gate driving circuit, the third voltage terminal V3 may be connected to a voltage signal VS/D of the gate driving circuit, and the fourth voltage terminal V4 may be connected to a voltage signal GCH of the gate driving circuit.

Figure 5:
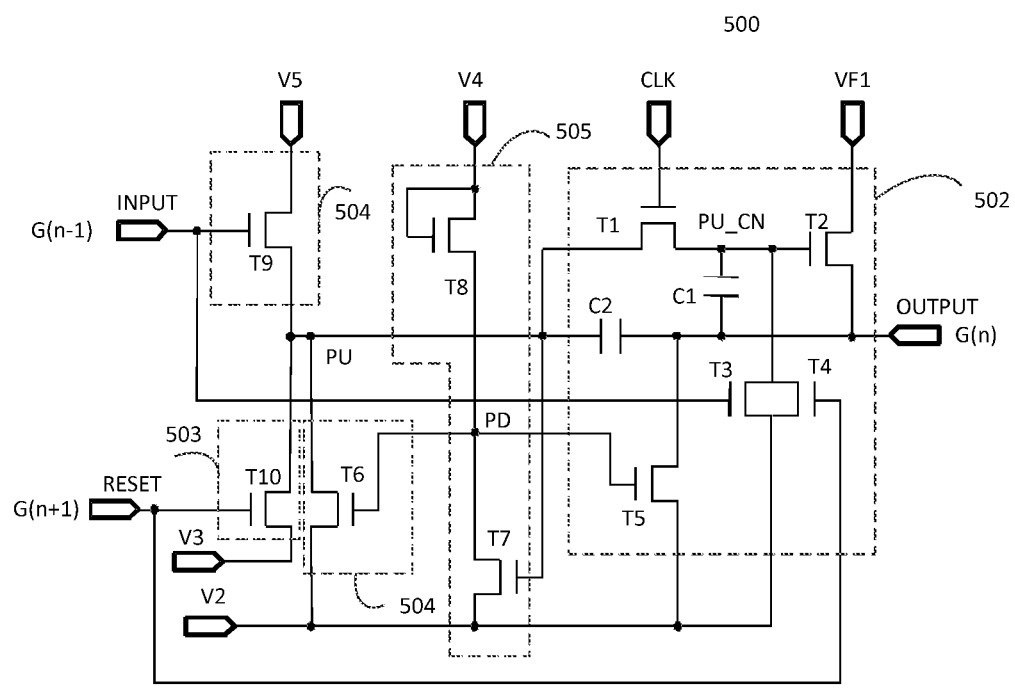
FIG. 5 illustrates an exemplary circuit diagram of a shift register unit according to an embodiment of the present disclosure.

FIG. 5 illustrates an exemplary circuit diagram of a shift register unit according to an embodiment of the present disclosure. Next, configuration of the shift register unit according to the embodiment of the present disclosure will be described in more detail in conjunction with FIGS. 4A, 4B and 5.

As shown in FIG. 5, the shift register unit 500 according to the embodiment of the present disclosure comprises an output sub-circuit 502. The output sub-circuit 502 may comprise a first transistor T1, a second transistor T2, and a first capacitor C1. Here, the first transistor T1 has a gate connected to a clock signal terminal CLK, a first electrode connected to the pull-up control node PU, and a second electrode connected to a gate of the second transistor T2 through a first node PU_CN. The second transistor T2 has a first electrode connected to the first voltage terminal VF1, and a second electrode connected to an output signal terminal OUTPUT; and the first capacitor C1 has a first terminal connected to the output signal terminal OUTPUT, and a second terminal connected to the first node PU_CN.

According to the embodiment of the present disclosure, the output sub-circuit 502 may further comprise a second capacitor C2 and a third transistor T3, wherein the second capacitor C2 has a first terminal connected to the pull-up control node PU, and a second terminal connected to the first terminal of the first capacitor C1. The third transistor T3 has a gate connected to an input signal terminal INPUT, a first electrode connected to a second voltage terminal V2 configured to receive a second voltage, and a second electrode connected to the first node PU_CN.

For example, capacitance values of the first capacitor C1 and the second capacitor C2 may range from 0.1 pF to 10 pF, and specific values thereof are related to a size, a resolution, and a load etc. of a display panel. According to the embodiment of the present disclosure, a capacitance value of the first capacitor C1 is greater than a capacitance value of the second capacitor C2. The capacitance value of the first capacitor C1 is greater than the capacitance value of the second capacitor C2 since the first capacitor is used to directly drive the second transistor T2 having a relatively large channel aspect ratio and a load in the entire display region.

For example, the output sub-circuit 502 may further comprise a fourth transistor T4 and a fifth transistor T5, wherein the fourth transistor T4 has a gate connected to a reset signal terminal RESET, a first electrode connected to the second level terminal V2, and a second electrode connected to the first node PU_CN. The fifth transistor T5 has a gate connected to a pull-down control node PD, a first electrode connected to the second voltage terminal V2, and a second electrode connected to the output signal terminal OUTPUT.

The shift register unit 500 may further comprise a pull-up control sub-circuit 504. The pull-up control sub-circuit 504 may comprise a sixth transistor T6 having a gate connected to the pull-down control node PD, a first electrode connected to the pull-up control node PU, and a second electrode connected to the second voltage terminal V2.

The shift register unit 500 may further comprise a pull-down control sub-circuit 505. The pull-down control sub-circuit 505 may comprise a seventh transistor T7 and an eighth transistor T8. The seventh transistor T7 has a gate connected to the pull-up control node PU, a first electrode connected to the second voltage terminal V2, and a second electrode connected to the pull-down control node PD. The eighth transistor T8 has a gate and a first electrode connected to the fourth voltage terminal V4, and a second electrode connected to the pull-down control node PD.

The shift register unit 500 may further comprise an input sub-circuit 501. The input sub-circuit 501 may comprise a ninth transistor T9 having a gate connected to the input signal terminal INPUT, a first electrode connected to a fifth voltage terminal V5 configured to receive a fifth voltage signal, and a second electrode connected to the pull-up control node PU.

The shift register unit 500 may further comprise a reset sub-circuit 503. The reset sub-circuit 503 comprises a tenth transistor T10 having a gate connected to the reset signal terminal RESET, a first electrode connected to a third voltage terminal V3 configured to receive a third voltage signal, and a second electrode connected to the pull-up control node PU.

For example, according to the embodiment of the present disclosure, the fourth voltage terminal V4 may be connected to a voltage signal GCH of a gate driving circuit, and the fifth voltage terminal V5 may be connected to a voltage signal VD/S of the gate driving circuit.

Figure 6:
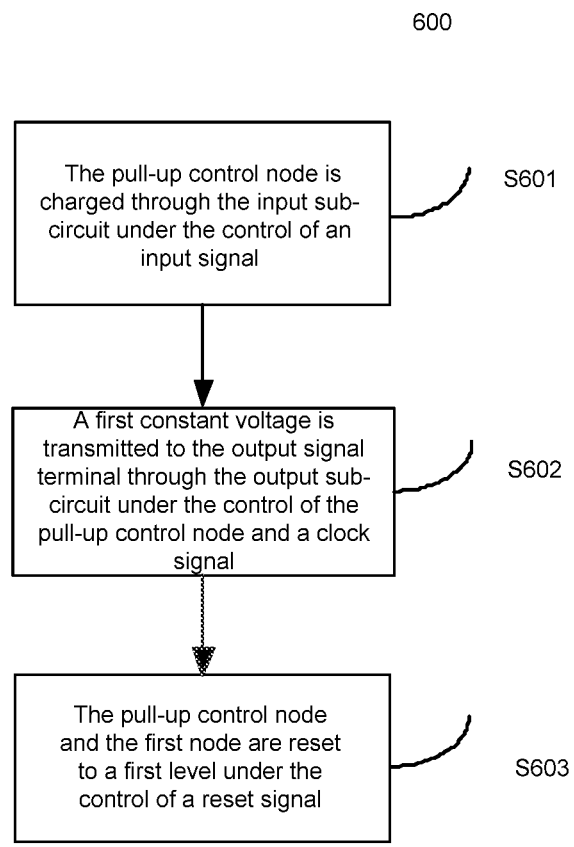
FIG. 6 illustrates a flowchart of a method for driving a shift register unit according to an embodiment of the present disclosure.

The present disclosure further provides a method for driving a shift register unit, which may be applied to the shift register unit according to the embodiment of the present disclosure. It should be illustrated that serial numbers of various steps in the following method are only used as a representation of the steps for convenience of description, and should not be regarded as indicating an execution order of the various steps. The method needs not to be performed exactly as shown, unless explicitly stated. FIG. 6 illustrates a flowchart of a method for driving a shift register unit according to an embodiment of the present disclosure. As shown in FIG. 6, the method 600 for driving a shift register unit according to the embodiment of the present disclosure may comprise the following steps.

In step S601, the pull-up control node is charged through the input sub-circuit under control of an input signal.

In step S602, a first constant voltage is transmitted to the output signal terminal through the output sub-circuit under control of the pull-up control node and a clock signal.

In step S603, the pull-up control node and the first node are reset to a first level under control of a reset signal.

For example, the first constant voltage is at a second level different from the first level. For example, in a case where the first constant voltage is 12V, the second voltage may be −12V.

Figure 7:
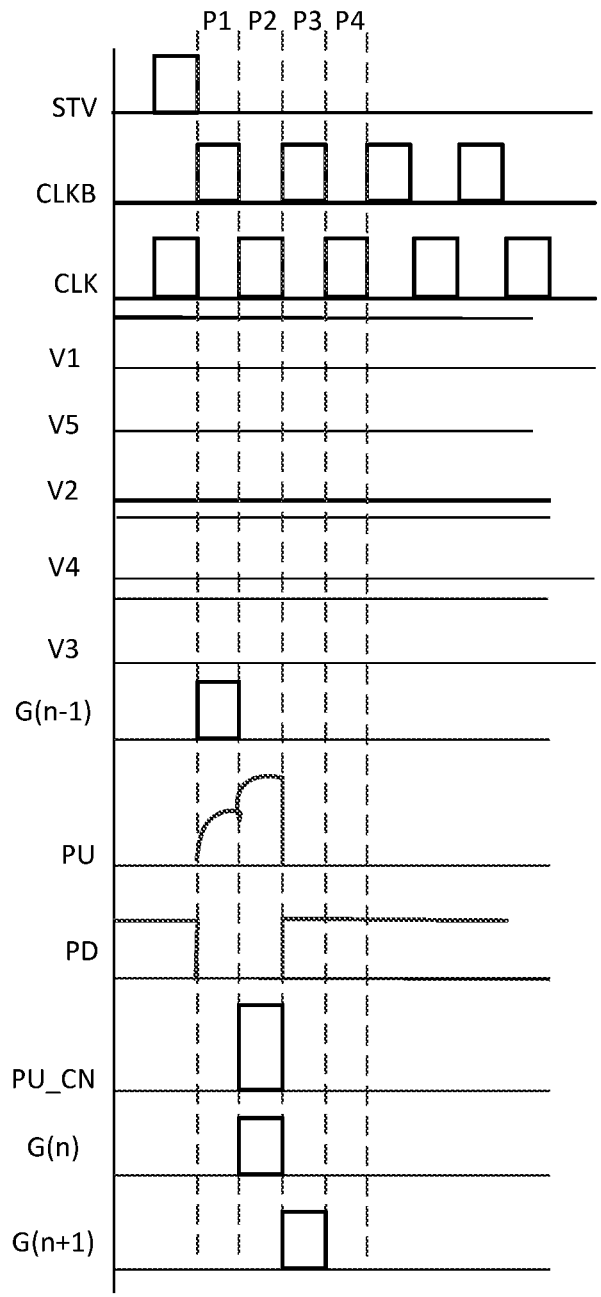
FIG. 7 illustrates an operational timing diagram of a shift register unit according to an embodiment of the present disclosure.

FIG. 7 illustrates an operational timing diagram of a shift register unit according to an embodiment of the present disclosure. As shown in FIG. 7, by taking an $n^{th}$ stage of shift register unit as an example, the $n^{th}$ stage of shift register unit has a clock signal terminal CLK configured to receive a clock signal Clk(n), an input signal terminal INPUT configured to receive an output signal G(n−1) of an $(n-1)^{th}$ stage of shift register unit as an input signal Input(n), a reset terminal RESET configured to receive an output signal G(n+1) of an $(n+1)^{th}$ stage of shift register unit as Reset(n), and an output signal terminal OUTPUT configured to output an output signal G(n) to an input signal terminal INPUT of the $(n+1)^{th}$ stage of shift register unit. Similarly, PU and PD in FIG. 7 illustrate voltage waveforms of a pull-up control node PU and a pull-down control node PD of the $n^{th}$ stage of shift register unit respectively, and PD_CN illustrates a voltage waveform of a first node PD_CN.

Next, an operation of the shift register unit according to the embodiment of the present disclosure will be described in detail with reference to FIGS. 5, 6, and 7.

As shown in FIG. 7, in a first phase P1, an input signal "Input" at the input signal terminal INPUT, i.e., an output signal G(n−1) of an $(n-1)^{th}$ stage of shift register unit, is a high level signal. The signal Input at a high level causes the ninth transistor T9 and the third transistor T3 to be turned on. A high voltage signal v5 (for example, VD/S) is output at the fifth voltage terminal V5, thereby charging the second capacitor C2, so that the potential at the pull-up control node PU is pulled up. At this time, the clock signal Clk of the clock signal terminal CLK is at a low level, the first transistor T1 is turned off, and the first node PU_CN is pulled down by the third transistor T3 to a low potential, so that the second transistor T2 is turned off. At the same time, as the fourth voltage v4 (for example, the signal GCH) input at the fourth voltage terminal V4 is at a high level, the eighth transistor T8 and the seventh transistor T7 are turned on. By designing a ratio between channel aspect ratios of the eighth transistor T8 and the seventh transistor T7, the potential at the pull-down control node PD is a low potential at this time, so that the fifth transistor T5 and the sixth transistor T6 are turned off, thereby ensuring that the pull-up control node PU is at a high level and the OUTPUT terminal is at a low level.

In a second phase P2, the input signal Input is at a low level and CLK is at a high level. At this time, the ninth transistor T9 and the third transistor T3 are turned off, the pull-up control node PU continues to be maintained at a high potential, and the first transistor T1 is maintained in a turn-on state, which causes the first node PU_CN to be at a high potential. In an example of, for example, VD/S=VDD=12V and VGL=−12V, the potential at the first node PU_CN is also about 12V at this time. At this time, the second transistor T2 is turned on, the first constant voltage Vf1 is output to OUTPUT through the second transistor T2, and thereby the signal G(n) at a high level is output. At this time, CLK and the first constant voltage Vf1 (for example, VDD) are both at a high level. Due to the bootstrapping effect of the first capacitor C1 and the second capacitor C2, the pull-up control node PU and the first node PU_CN are both pulled up to a higher voltage. In an example of, for example, VD/S=VDD=12V and VGL=−12V, the potential at the first node PU_CN is about 22V at this time. The potential at the first node PU_CN is instantaneously increased from, for example, the previous 12V to 22V, and therefore only a stable high voltage state of the first node PU_CN is shown in the timing diagram of FIG. 7. At this time, the pull-up control node PU is at a high potential, and the seventh transistor T7 is still maintained in a turn-on state, so that the fifth transistor T5 and the sixth transistor T6 continue to be turned off, thereby ensuring stable output of the output signal.

In a third phase P3, the reset signal Reset received at the reset signal terminal RESET, i.e., the output G(n+1) of the (n+1)$^{th}$ stage of shift register, is at a high level. The reset signal Reset at a high level causes the tenth transistor T10 and the fourth transistor T4 to be turned on. The tenth transistor T10 is turned on, to cause the pull-up control node PU to become a low potential of VS/D. At the same time, CLK is at a low level, the first transistor T1 is turned off, and the fourth transistor T4 is turned on, so that the potential at the first node PU_CN is pulled down. Thereby, the second transistor T2 is turned off, and the first constant voltage is no longer output to the OUTPUT terminal. At this time, as the potential at the pull-up control node PU is pulled down, the seventh transistor T7 is in a turn-off state, and the pull-down control node PD is no longer discharged. It can be understood by those skilled in the art that the third transistor T3 and the fourth transistor T4 are provided to ensure that the first node PU_CN is at a low potential in a charged state.

In a fourth phase P4, the fourth voltage (for example, the signal GCH) input at the fourth voltage terminal V4 is at a high level, and the eighth transistor T8 continues to be turned on. At this time, the potential at the pull-down control node PD is pulled up, which causes the seventh transistor T7 and the sixth transistor T6 to be turned on, thereby causing the first capacitor C1 and the second capacitor C2 to be discharged and causing the pull-up control node PU and the output signal terminal OUTPUT to be further de-noised. This eliminates a coupling noise voltage generated by the clock signal Clk, thereby ensuring stability of the output signal.

It can be understood by those skilled in the art that the first capacitor C1 is configured for bootstrapping at the time of driving, and the second capacitor C2 is configured for a function of registering a shifted voltage. Thus, a capacitance value of the first capacitor C1 may be designed to be greater than a capacitance value of the second capacitor C2.

According to the shift register unit according to the embodiment of the present disclosure, the first transistor T1 and the first capacitor C1 are introduced. The second transistor T2 for driving the AA region is driven by the first constant voltage which is a direct voltage, and when the first constant voltage drives the second transistor T2, as there is no periodic charging and discharging operation for the capacitor inherent to the second transistor T2, the power consumption of the second transistor T2 can be reduced. In addition, the first transistor T1 connected to the clock signal terminal CLK is only used as a switch, and a size of the first transistor T1 may be much less than that of a transistor connected to a clock signal terminal in the related art, for example, the transistor M3 in FIG. 1. Thereby, dynamic power consumption generated by the first transistor T1 due to the clock signal can be reduced. In summary, the power consumption of the entire shift register unit can be reduced.

Figure 8A:
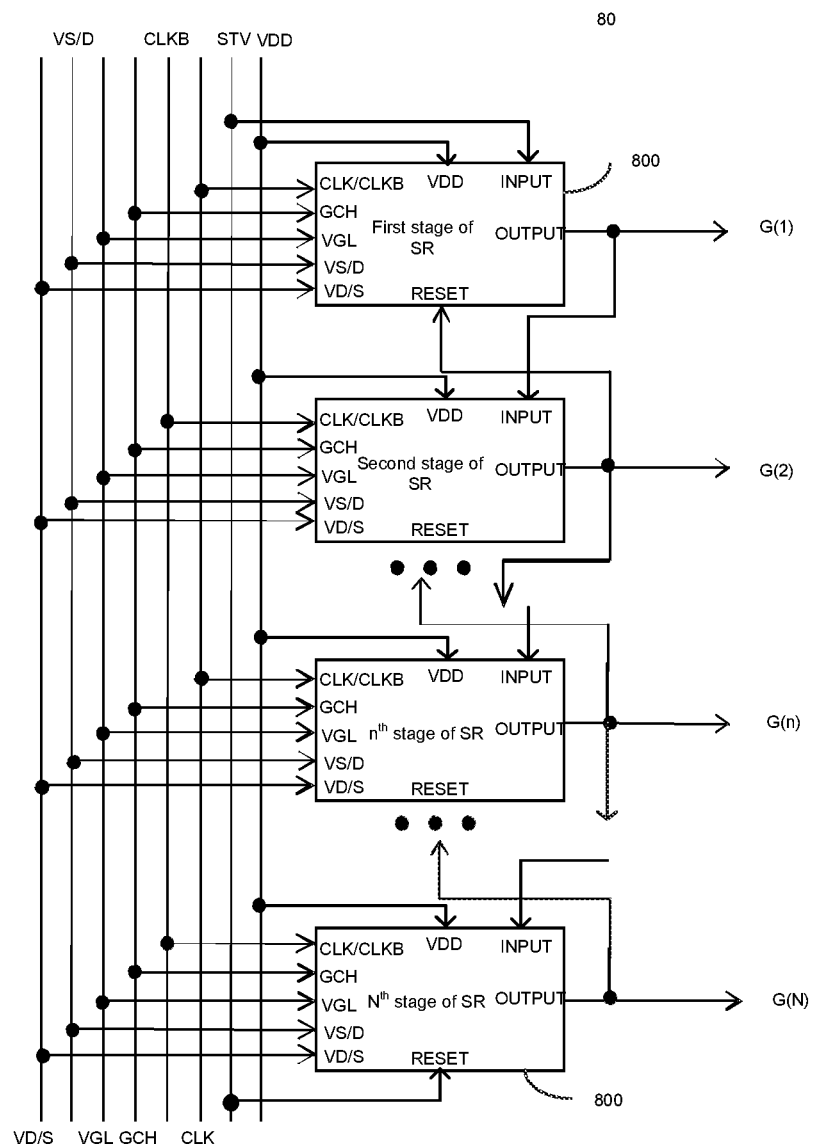
FIG. 8A illustrates an exemplary cascade diagram of a gate driving circuit according to the present disclosure.

According to the present disclosure, there is provided a gate driving circuit, comprising a plurality of cascaded shift register units according to the embodiment of the present disclosure. FIG. 8A illustrates an exemplary cascade diagram of a gate driving circuit according to the present disclosure. As shown in FIG. 8A, a gate driving circuit 80 according to an embodiment of the present disclosure may comprise a plurality of cascaded shift register units 800 according to an embodiment of the present disclosure. The gate driving circuit 80 further comprises a first signal line VDD to which a first voltage terminal (for example, the VDD terminal in FIG. 7) of each of the shift register units 800 is connected. The gate driving circuit 80 further comprises a clock signal line CLK/CLKB to which clock signal terminals CLK of the shift register units are connected.

It can be understood by those skilled in the art that the n$^{th}$ stage of shift register unit SR(n) has a clock signal terminal CLK configured to receive a clock signal Clk(n), an INPUT terminal configured to receive an output signal G(n−1) of an (n−1)$^{th}$ stage of shift register unit SR(n−1), an output signal terminal OUTPUT configured to output an output signal Output(n) to an input terminal INPUT of an (n+1)$^{th}$ stage of shift register SR(n+1), and a reset terminal RESET configured to receive an output signal G(n+1) of the (n+1)$^{th}$ stage of shift register unit SR(n+1). A manner in which other stages of shift register units in the gate driving circuit are connected will be apparent to those skilled in the art. For example, unlike the n$^{th}$ stage of shift register unit, an INPUT terminal of a first stage of shift register unit is connected to a vertical starting signal (STV) line, and a RESET terminal of an N$^{th}$ stage of shift register unit is connected to the STV line.

The gate driving circuit 80 shown in FIG. 8A may be used for gate forward scanning and gate reverse scanning. For convenience of understanding, the term "forward scanning" herein refers to sequentially generating scanning driving signals G(1), G(2) . . . . G(N) from a first stage of SR to an N$^{th}$ stage of SR in FIG. 8A for display of one frame of image. The term "reverse scanning" refers to sequentially generating scanning driving signals G(N), G(N−1) . . . . G(1) from the N$^{th}$ stage of SR to the first stage of SR in FIG. 8A for display of one frame of image. It can be understood by those skilled in the art that in an example of forward scanning, the clock signal terminal CLK of the n$^{th}$ stage of shift register unit SR(n) receives the clock signal Clk(n), the voltage signal VD/S is a high level signal, and the voltage signal VS/D is a low level signal. In an example of reverse scanning, the clock signal terminal CLK of the n$^{th}$ stage of shift register unit SR(n) receives a clock signal Clkb(n) inverted from the clock signal Clk(n), the voltage signal VD/S is a low level signal, and the voltage signal VS/D is a high level signal.

Figure 8B:
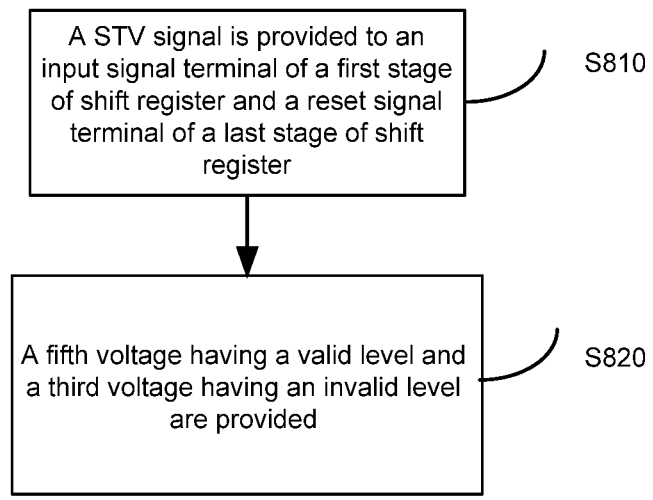
FIG. 8B illustrates a flowchart of a method for driving a gate driving circuit according to an embodiment of the present disclosure.

FIG. 8B illustrates a flowchart of a method for driving a gate driving circuit according to an embodiment of the present disclosure. FIG. 8B corresponds to a case of forward scanning.

In step S810, a vertical starting signal (STV) is provided to an input signal terminal of a first stage of shift register and a reset signal terminal of a last stage of shift register.

In step S820, a fifth voltage having a valid level (i.e., VD/S at a high level) and a third voltage having an invalid level (i.e., VS/D at a low level) are provided.

Figure 8C:
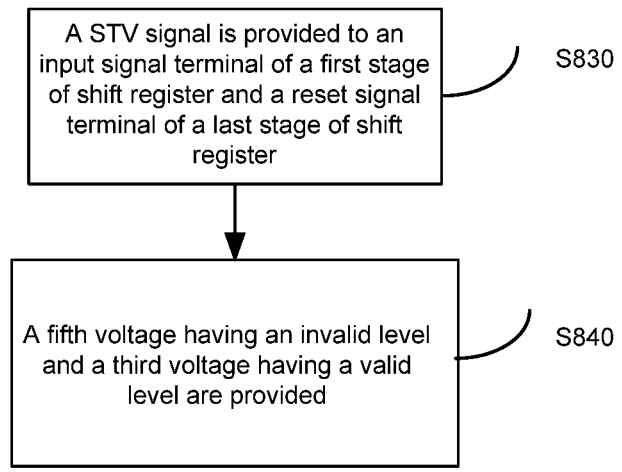
FIG. 8C illustrates a flowchart of a method for driving a gate driving circuit according to an embodiment of the present disclosure.

FIG. 8C illustrates a flowchart of a method for driving a gate driving circuit according to an embodiment of the present disclosure. FIG. 8C corresponds to a case of reverse scanning.

In step S830, a vertical starting signal is provided to an input signal terminal of a first stage of shift register and a reset signal terminal of a last stage of shift register.

In step S840, a fifth voltage having an invalid level (i.e., VD/S at a low level) and a third voltage having a valid level (i.e., VS/D at a high level) are provided.

In other embodiments, forward scanning and reverse scanning may also be performed in turn. For example, forward scanning is performed in odd-numbered frames and reverse scanning is performed in even-numbered frames. Alternatively, reverse scanning is performed in odd-numbered frames and forward scanning is performed in even-numbered frames. The description is no longer illustrated here.

According to an embodiment of the present disclosure, the first signal line configured to provide the first constant voltage, such as VDD, is connected to the first voltage terminal in the shift register unit. It can be understood by those skilled in the art that the cascade manner of the gate driving circuit in FIG. 8A is merely an example, and the embodiment of the present disclosure is not limited thereto. For example, FIG. 8A illustrates a case where two clock signals are used for the gate driving circuit. The embodiments of the present disclosure may of course be applied to a case where four, six, or eight clock signals are used. For example, when four clock signals Clk(n) to Clk(n+3) are used, the clock signal terminal CLK of the $n^{th}$ stage of shift register unit SR(n) receives the clock signal Clk(n), the INPUT terminal of the $n^{th}$ stage of shift register unit SR(n) may receive an output signal Output(n−2) of an $(n-2)^{th}$ stage of shift register unit SR(n−2), the output signal Output(n) of the output signal terminal OUTPUT of the $n^{th}$ stage of shift register unit SR(n) is input to an input signal terminal INPUT of the $(n+2)^{th}$ stage of shift register SR(n+2), and the reset signal terminal RESET of the $n^{th}$ stage of shift register unit SR(n) is configured to receive an output signal Output (n+3) of an $(n+3)^{th}$ stage of shift register unit SR(n+3). The case where six or eight clock signals are used will also be apparent to those skilled in the art.

Figure 9:
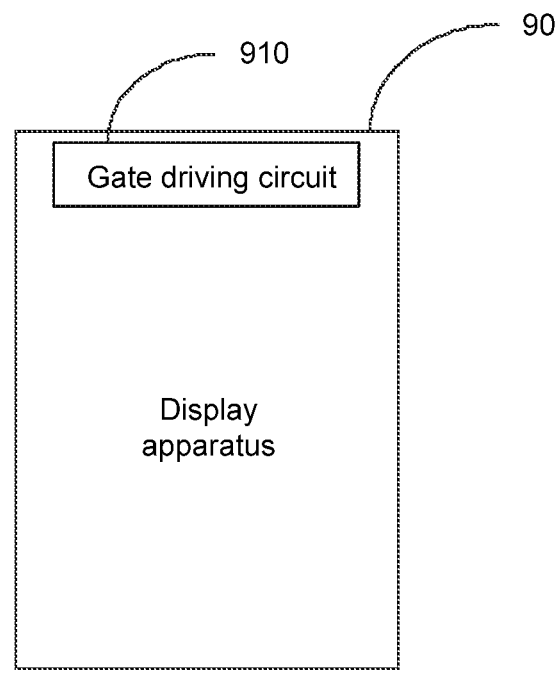
FIG. 9 illustrates a schematic block diagram of a display apparatus according to an embodiment of the present disclosure.

According to another aspect of the present disclosure, there is provided a display apparatus. FIG. 9 illustrates a schematic block diagram of a display apparatus according to an embodiment of the present disclosure. As shown in FIG. 9, the display apparatus 90 may comprise a gate driving circuit 910 according to an embodiment of the present disclosure. The display apparatus 90 according to the embodiment of the present disclosure may be any product or component having a display function such as an electronic paper, a mobile phone, a tablet computer, a television, a display, a notebook computer, a digital photo frame, a navigator, etc.

The specific embodiments described above further explain the purposes, technical solutions and beneficial effects of the embodiments of the present disclosure in detail. It should be understood that the above description is only illustrative of specific embodiments of the present disclosure, and is not intended to limit the present disclosure. Any modifications, equivalents, improvements, etc. within the spirit and principles of the present disclosure should all be included in the protection scope of the present disclosure.

We claim:

1. A shift register unit, comprising an input signal terminal configured to receive an input signal, a clock signal terminal configured to receive a clock signal, a first voltage terminal configured to receive a first constant voltage, a second voltage terminal configured to receive a second voltage signal, a third voltage terminal configured to receive a third voltage signal, an output signal terminal configured to output a gate control signal, and a reset signal terminal configured to receive a reset signal, the shift register unit further comprising:

an input sub-circuit connected to the input signal terminal and a pull-up control node, and configured to charge the pull-up control node under control of the input signal;

an output sub-circuit connected to the pull-up control node, the clock signal terminal, the first voltage terminal, and the output signal terminal, and configured to output the first constant voltage to the output signal terminal under control of the clock signal and the pull-up control node; and a reset sub-circuit connected to the pull-up control node, the reset signal terminal, and the third voltage terminal respectively, and configured to reset the pull-up control node to the third voltage under control of the reset signal, wherein the output sub-circuit comprises a first transistor, a second transistor, a third transistor, a fourth transistor, a fifth transistor, a first capacitor, and a second capacitor, wherein:

the first transistor has a gate connected to the clock signal terminal, a first electrode connected to the pull-up control node, and a second electrode connected to a gate of the second transistor via a first node;

the second transistor has a first electrode connected to the first voltage terminal, and a second electrode connected to the output signal terminal;

the first capacitor has a first terminal connected to the output signal terminal, and a second terminal connected to the first node;

the second capacitor has a first terminal connected to the pull-up control node, and a second terminal connected to the first terminal of the first capacitor;

the third transistor has a gate connected to the input signal terminal, a first electrode connected to the second voltage terminal, and a second electrode connected to the first node;

the fourth transistor has a gate connected to the reset signal terminal, a first electrode connected to the second voltage terminal, and a second electrode connected to the first node; and the fifth transistor has a gate connected to a pull-down control node, a first electrode connected to the second voltage terminal, and a second electrode connected to the output signal terminal.

2. The shift register unit according to claim 1, wherein the first capacitor has a capacitance value greater than that of the second capacitor.

3. The shift register unit according to claim 1, further comprising a fourth voltage terminal configured to receive a fourth voltage signal, a pull-up control sub-circuit, and a pull-down control sub-circuit, wherein the pull-up control sub-circuit is connected to the pull-up control node, the pull-down control node, and the second voltage terminal, and is configured to provide the second voltage signal from the second voltage terminal to the pull-up control node under control of the pull-down control node; and the pull-down control sub-circuit is connected to the pull-up control node, the pull-down control node, the second voltage terminal, and the fourth voltage terminal, and is configured to provide the second voltage signal or the fourth voltage signal to the pull-down control node under control of the pull-up control node and the fourth voltage signal.

4. The shift register unit according to claim 3, wherein the pull-up control sub-circuit comprises a sixth transistor having a gate connected to the pull-down control node, a first electrode connected to the pull-up control node, and a second electrode connected to the second voltage terminal; and the pull-down control sub-circuit comprises a seventh transistor and an eighth transistor, wherein the seventh transistor has a gate connected to the pull-up control node, a first electrode connected to the second voltage terminal, and a second electrode connected to the pull-down control node; and the eighth transistor has a gate and a first electrode connected to the fourth voltage terminal, and a second electrode connected to the pull-down control node.

5. The shift register unit according to claim 1, further comprising a fourth voltage terminal configured to receive a fourth voltage signal, a pull-up control sub-circuit, and a pull-down control sub-circuit, wherein
the pull-up control sub-circuit is connected to the pull-up control node, the pull-down control node, and the second voltage terminal, and is configured to provide the second voltage signal from the second voltage terminal to the pull-up control node under control of the pull-down control node; and
the pull-down control sub-circuit is connected to the pull-up control node, the pull-down control node, the second voltage terminal, and the fourth voltage terminal, and is configured to provide the second voltage signal or the fourth voltage signal to the pull-down control node under control of the pull-up control node and the fourth voltage signal.

6. The shift register unit according to claim 5, wherein the pull-up control sub-circuit comprises a sixth transistor having a gate connected to the pull-down control node, a first electrode connected to the pull-up control node, and a second electrode connected to the second voltage terminal; and
the pull-down control sub-circuit comprises a seventh transistor and an eighth transistor, wherein the seventh transistor has a gate connected to the pull-up control node, a first electrode connected to the second voltage terminal, and a second electrode connected to the pull-down control node; and the eighth transistor has a gate and a first electrode connected to the fourth voltage terminal, and a second electrode connected to the pull-down control node.

7. The shift register unit according to claim 1, further comprising a fifth voltage terminal configured to receive a fifth voltage signal, wherein
the input sub-circuit comprises a ninth transistor having a gate connected to the input signal terminal, a first electrode connected to the fifth voltage terminal, and a second electrode connected to the pull-up control node.

8. The shift register unit according to claim 1, wherein the reset sub-circuit comprises a tenth transistor having a gate connected to the reset signal terminal, a first electrode connected to the third voltage terminal, and a second electrode connected to the pull-up control node.

9. A gate driving circuit, comprising a plurality of cascaded shift register units according to claim 1, wherein
the input signal terminal of a first stage of shift register unit and the reset signal terminal of a last stage of shift register unit are connected to a vertical starting signal line;
the input signal terminal of each stage of shift register unit other than the first stage of shift register unit is connected to an output signal terminal of a previous stage of shift register unit; and
the reset signal terminal of each stage of shift register unit other than the last stage of shift register unit is connected to an output signal terminal of a next stage of shift register unit.

10. A display apparatus, comprising the gate driving circuit according to claim 9.

11. A method for driving the shift register unit according to claim 1, comprising:
in a first phase, charging the pull-up control node through the input sub-circuit under control of the input signal;
in a second phase, transmitting the first constant voltage to the output signal terminal through the output sub-circuit under control of the pull-up control node and the clock signal; and
in a third phase, resetting the pull-up control node and the first node to a first level under control of the reset signal.

12. The method according to claim 11, wherein the first constant voltage has a valid level and the first level is an invalid level.

13. A method for driving the gate driving circuit according to claim 9, comprising:
providing a vertical starting signal to the input signal terminal of the first stage of shift register unit and the reset signal terminal of the last stage of shift register unit; and
providing a fifth voltage having a valid level and a third voltage having an invalid level.

14. A method for driving the gate driving circuit according to claim 9, comprising:
providing a vertical starting signal to the input signal terminal of the first stage of shift register unit and the reset signal terminal of the last stage of shift register unit; and
providing a fifth voltage having an invalid level and a third voltage having a valid level.

15. A method for driving the gate driving circuit according to claim 9, comprising:
providing a vertical starting signal to the input signal terminal of the first stage of shift register unit and the reset signal terminal of the last stage of shift register unit;
providing, in odd-numbered frames, a fifth voltage having a valid level and a third voltage having an invalid level; and
providing, in even-numbered frames, a fifth voltage having an invalid level and a third voltage having a valid level.

16. A method for driving the gate driving circuit according to claim 9, comprising:
providing a vertical starting signal to the input signal terminal of the first stage of shift register unit and the reset signal terminal of the last stage of shift register unit;
providing, in odd-numbered frames, a fifth voltage having an invalid level and a third voltage having a valid level; and
providing, in even-numbered frames, a fifth voltage having a valid level and a third voltage having an invalid level.

* * * * *